United States Patent [19]

DePuy

[11] 4,350,956
[45] Sep. 21, 1982

[54] LEVEL SHIFTING AND FILTERING CIRCUIT

[75] Inventor: Robert P. DePuy, Cherry Hill, N.J.

[73] Assignee: General Electric Company, Philadelphia, Pa.

[21] Appl. No.: 198,891

[22] Filed: Oct. 20, 1980

[51] Int. Cl.³ .................. H03K 13/32; H03F 3/45
[52] U.S. Cl. .................................. 328/167; 361/88; 330/107
[58] Field of Search ............ 328/165, 167; 330/107; 361/88

[56] References Cited

U.S. PATENT DOCUMENTS

| 4,207,543 | 6/1980 | Izakson et al. | 328/167 X |
| 4,208,635 | 6/1980 | Fazakerly et al. | 328/167 X |
| 4,275,453 | 6/1981 | Wagner | 328/167 X |
| 4,315,229 | 2/1982 | Greaves et al. | 328/167 X |

OTHER PUBLICATIONS

Solid-State Devices Manual, RCA Solid-State Division, Somerville, N.J., 08876, Copyright 1975 by RCA Corporation, paragraph entitled "General-Purpose Operational Voltage Amplifier (OVA)", pp. 195-199.

Primary Examiner—John S. Heyman
Attorney, Agent, or Firm—William Freedman; John P. McMahon

[57] ABSTRACT

A circuit is disclosed which performs two functions: (1) it develops a D.C. voltage signal which is proportional to the difference between the D.C. voltage components of a first and a second voltage, each comprising a D.C. voltage component and an A.C. voltage component impressed thereon, and (2) it filters the A.C. voltage components of both the first and second voltages. This circuit comprises cascade-connected first and second networks, each comprising an operational amplifier, with the output of the first network coupled to the input of the second network. Said first voltage is supplied as an input to the first network, and said second voltage is supplied as an input to the second network. The second network develops a D.C. output signal that is representative of the difference between the D.C. voltage components of the first and second voltages.

5 Claims, 3 Drawing Figures

Fig. 2.
RELATIONSHIP (1) TO EXPRESS $e_0$ OF FIGURE 1:

$$e_0 = \frac{R5\left[e_a R2 R7 - e_b R1 R4 \left(1 + \frac{(R1R2+R1R3+R2R3)C2S}{R1} + R2R3C1C2S^2\right)\right]}{R1R4R7\left[1 + \frac{(R1R2+R1R3+R2R3)C2S}{R1} + R2R3C1C2S^2\right]\left[1 + \frac{(R4R5R6+R4R5R7+R4R6R7+R5R6R7)C4S}{R4R7} + R5R6C3C4S^2\right]}$$

Fig. 3.
RELATIONSHIP (3) TO EXPRESS $e_0$ OF FIGURE 1:

$$e_0 = \left(\frac{R2}{R1}\right)\left(\frac{e_a - e_b\left(1 + \frac{(R1R2+R1R3+R2R3)C2S}{R1} + R2R3C1C2S^2\right)}{\left(1 + \frac{(R1R2+R1R3+R2R3)C2S}{R1} + R2R3C1C2S^2\right)^2}\right)$$

LEVEL SHIFTING AND FILTERING CIRCUIT

BACKGROUND OF THE INVENTION

This invention relates to a level shifting and filtering circuit, and more particularly, to a level shifting and filtering circuit for developing a D.C. voltage signal substantially free of A.C. voltage and having a voltage level proportional to the difference between the D.C. components of a first and a second voltage, each of which includes D.C. and A.C. components.

In electrical systems, such as high voltage distribution networks, signals are sent over telephone lines, which are commonly called pilot wires, to detect power system faults. It is desirable to continuously monitor the status of the pilot wires. To accomplish such continuous monitoring it may be desirable to determine the difference between the D.C. components of two voltage signals, (1) a first voltage $e_a$ from one pilot wire to a first terminal of a power supply and (2) a second voltage $e_b$ across this power supply appearing between said first terminal and another terminal thereof. The monitoring device typically desires a determination of the D.C. current flowing in the pilot wires which is a voltage proportional to the D.C. pilot wire current flowing through a resistor imposed between $e_a$ and $e_b$. Because the pilot wires are sourced with current transformers, a large component of A.C. current may be circulating through the pilot wires, causing a large A.C. voltage to be present on the first voltage signal. The power supply is normally an electronic circuit which typically will have some ripple voltage. The monitoring circuit may be susceptible to erroneous operation if the A.C. voltage signal existing in the proportional D.C. voltage difference signal is too high.

The use of differential amplifiers to develop an electrical signal having a D.C. voltage proportional to the difference between a first and a second voltage signal is well known. Also, the use of reactive components to develop filtering networks to smooth or reduce the A.C. voltage signals, such as may exist on pilot wires or the ripple voltage across a power supply, is well known. However, it is desirable to have one circuit for the development of both an electrical signal proportional to the D.C. voltage difference between two voltage signals and also to filter the A.C. voltages existing on the pilot wire system and power supply.

Accordingly, it is an object of the present invention to provide a monitoring circuit that develops an electrical signal substantially free from A.C. voltage and also proportional to a D.C. voltage difference between a first and a second voltage signal.

It is another object of the present invention to provide a monitoring circuit having substantially greater filtering of a first voltage signal relative to the filtering of a second voltage signal.

Still further, it is another object of the present invention to provide a monitoring circuit in which the transfer function and gain of the circuit may be easily adapted to various conditions.

These and other objects of the invention will become apparent to those skilled in the art upon consideration of the following description of the invention.

SUMMARY OF THE INVENTION

The present invention is related to a level shifting and filtering circuit for developing a D.C. output signal having a level which is representative of the difference between the D.C. voltage levels of a first and a second voltage signal each comprising D.C. and A.C. components. The first voltage signal being present between a first and second terminal and the second voltage signal being present between a third and a fourth terminal. The second and fourth terminals are coupled to each other. The circuit filters the A.C. voltage component of the first and the second voltage signals in the development of the D.C. output signal. The filtering of the A.C. voltage component of the first voltage signal is performed to an extent which is substantially greater than the filtering being performed on the second voltage signal. The circuit comprises a first and a second network. The first network has a first plurality of resistive and capacitive elements and further has a first differential means having a first and a second input for developing an output signal representative of the voltage difference applied between the first and the second inputs. The first input is coupled to the first terminal by a first portion of the first plurality of resistive and capacitive elements. The second input is coupled to the second terminal. The output signal of the first differential means is fed-back to the first input by a second portion of the first plurality of resistive and capacitive elements. The first plurality of resistive and capacitive elements have preselected values that determine the closed-loop response of the first network and reduce the A.C. voltage component existing in the output signal of the first differential means by a predetermined amount. The second network has a second plurality of resistive and capacitive elements and further has a second differential means having a first and a second input for developing an output signal representative of the voltage difference applied between the first and the second inputs. The first input is coupled to the third terminal by a first portion of the second plurality of resistive and capacitive elements. The first input is also coupled to the output signal of the first differential means by a second portion of the second plurality of resistive and capacitive elements. The second input is coupled to the fourth terminal. The output signal of the second differential means is fed-back to the first input by a third portion of the second plurality of resistive and capacitive elements. The second plurality of resistive and capacitive elements have preselected values that determine the closed-loop response of the second network and reduce the A.C. component existing in the output signal of the second differential means by a predetermined amount. The output signal of said second differential means is representative of the voltage difference between the D.C. voltage levels of the first and the second voltage signals.

The features of the invention believed to be novel are set forth with particularity in the appended claims. The invention, itself, however, both as to its organization and operation, together with further objects and advantages thereof, may best be understood by reference to the following description taken in conjunction with the accompanying drawings.

BRIEF DESCRIPTION OF THE DRAWINGS

FIG. 2 depicts the transfer function of the circuit shown in FIG. 1.

FIG. 3 depicts a simplified transfer function of the circuit shown in FIG. 1.

DETAILED DESCRIPTION OF THE PREFERRED EMBODIMENT

Figure 1:
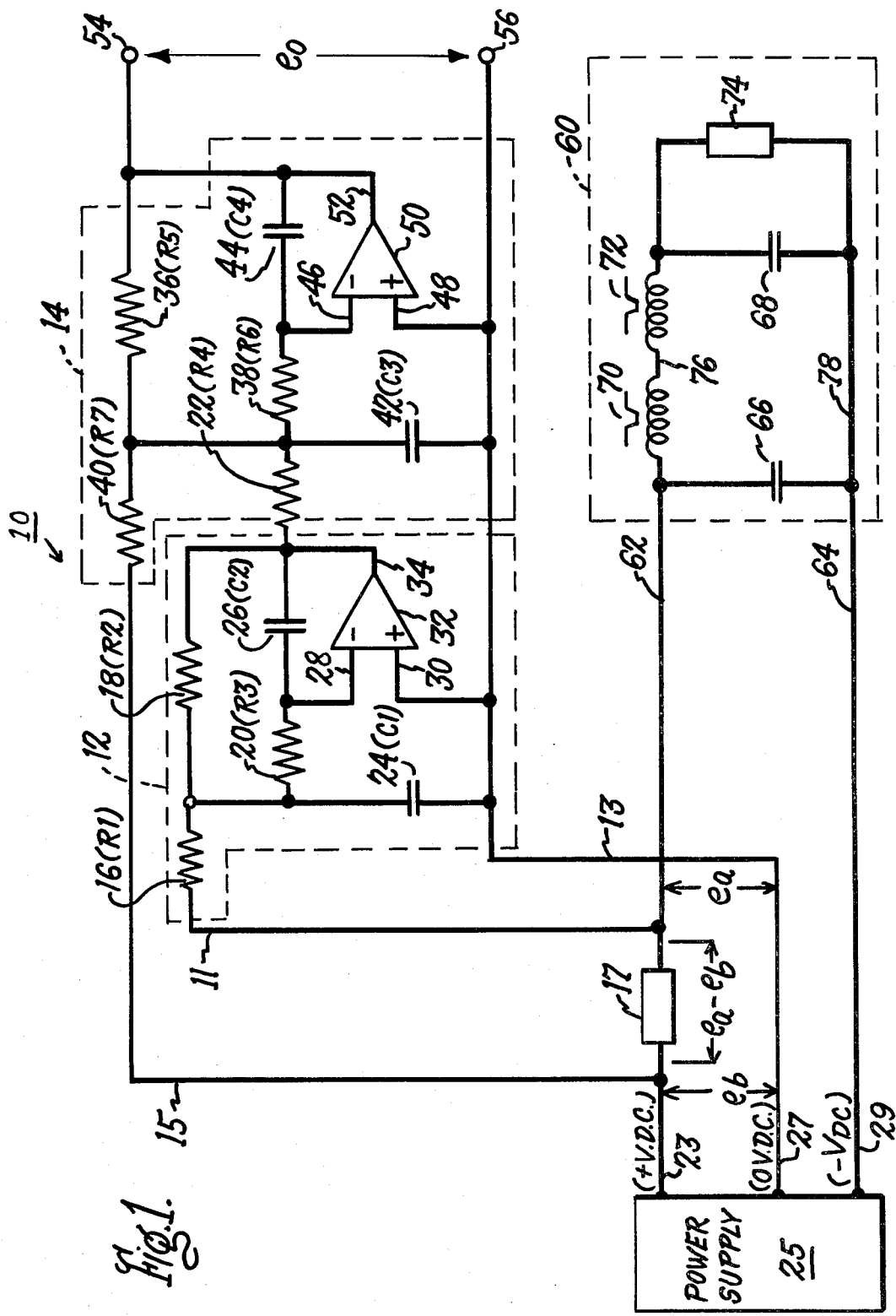
FIG. 1 shows a circuit arranged in accordance with the preferred embodiment of the invention.

FIG. 1 shows a circuit arrangement 10 having a first network 12 and a second network 14. Networks 12 and 14 are serially arranged in a cascade manner in which an output 34 of network 12 is coupled to the input of network 14 via a resistor 22.

Networks 12 and 14 are adapted for energization by a first voltage signal $e_a$ and a second voltage signal $e_b$ respectively. For the embodiment shown in FIG. 1, the signals $e_a$ and $e_b$ are used to monitor the status of a typical pilot wire protection system 60 for a high voltage distribution network (not shown). The pilot wire protection system 60 comprises, in part, a pair of conventional current transformers 70 and 72 respectively positioned at opposite ends of a portion of the distribution network being protected. The current transformers may be a source of a large component of A.C. current circulating within and developing large A.C. voltages in the pilot wire protection system 60.

The pilot wire protection system further comprises a pair of capacitors 66 and 68 each arranged across a pair of pilot wires 76 and 78 to circulate the current in the current transformers 70 and 72. A load resistor 74 is also arranged across the capacitor 68 to provide a path for a D.C. current to flow. Most of the A.C. portion of the voltage signal $e_a$ is developed by the A.C. current flowing through capacitor 66. The present invention determines the status of the pilot wires 76 and 78 by monitoring the D.C. voltage difference between the D.C. components of the voltage signals $e_a$ and $e_b$. Under faulted conditions of pilot wires 76 and 78, such as opened or shorted wires, the proportional D.C. voltage difference between signals $e_a$ and $e_b$ is less than or exceeds a predetermined range of values, which represent alarm conditions with the pilot wire protection system 60. The pilot wire protection system 60 is not considered part of this invention and therefore will not be discussed in detail.

The voltage signal $e_b$ is developed by a conventional power supply 25 and has a typical value of 12 V. D.C. as measured between its terminal 23 (+V.D.C.) and its terminal 27 (O.V.D.C.) as shown in FIG. 1. Voltage signal $e_a$ is measured between a conductor 62, connected to pilot wire 76, and the terminal 27 of the power supply. The terminal 27 (O.V.D.C.) is also connected to a conductor 13 which is further connected to an input terminal of networks 12 and 14 forming a common buss. The power supply 25 has an additional terminal 29 (−V.D.C.) which is connected to the pilot wire 78 via a conductor 64.

The D.C. component of voltage signal $e_a$ is determined by resistor 74 and the A.C. component of voltage signal $e_a$ is developed by the A.C. current flowing through capacitor 66. The voltage signal $e_a$ may typically contain a high A.C. voltage component that is determined by the load current of the high-voltage distribution network.

As shown in FIG. 1, a resistor 17 is interposed between the voltage signals $e_a$ and $e_b$, and the voltage drop across resistor 17 is shown as a voltage difference ($e_a - e_b$). As further shown in FIG. 1, one side of the resistor 17, representative of the signal $e_a$, is connected to an input of network 12 via a conductor 11. Similarly, the other side of the resistor 17, representative of the signal $e_b$, is connected to an input of network 14 via a conductor 15.

As will be further described, the circuit arrangement 10 having networks 12 and 14 develop a D.C. voltage output signal $e_o$ representative of the D.C. voltage level difference between signals $e_a$ and $e_b$. This voltage level difference is representative of the voltage difference $e_a - e_b$ existing across resistor 17. The output signal $e_o$ may be utilized by a further device, to determine the status of the pilot wires of the pilot wire system. The level of the A.C. voltage component existing in output signal $e_o$ is of importance in that a high level of A.C. voltage may cause circuit misoperation in determining the status of the pilot wire system. Circuit arrangement 10 develops, in part, an output signal $e_o$ having a relatively low A.C. voltage component.

Circuit arrangement 10 performs two functions, (1) it develops an output signal $e_o$ between terminals 54 and 56 having a D.C. voltage level proportional to the voltage level difference between signal $e_a$ and $e_b$, and (2) it provides for a higher suppression or filtering of the A.C. voltage component existing in the voltage signal $e_a$ than the filtering of the A.C. voltage component existing in the voltage signal $e_b$. These two functions are accomplished by the cascaded networks 12 and 14.

Network 12 has a first resistor 16 (R1) having a first end that is coupled to the voltage signal $e_a$ via conductor 11. The other side of resistor 16 (R1) is connected to a second resistor 18 (R2), a third resistor 20 (R3) and a first capacitor 24 (C1). Capacitor 24 (C1) has its other end connected to the common buss 13. The other side of resistor 18 (R2) is connected to an output 34 of a first operational amplifier 32. The other side of resistor 20 (R3) is connected to an inverting input 28 of the operational amplifier 32 which has its non-inverting input 30 connected to the buss 13. Resistor 20 (R3) is also connected to one end of a second capacitor 26 (C2) which has its other end connected to the output 34. The output 34 of operational amplifier 32 is connected to one end of fourth resistor 22 (R4) of the second network 14. Operational amplifier 32 may be one of the four (4) operational amplifiers of integrated circuit type LM224, supplied by National Semiconductor Corp. of 2900 Semiconductor Drive, Santa Clara, Calif. 95051.

Network 14 has a seventh resistor 40 (R7) having its first end connected to the voltage signal $e_b$ via conductor 15. The other side of resistor 40 (R7) is connected to (1) the other side of the resistor 22 (R4), (2) to one side of a fifth resistor 36 (R5), (3) to one side of a sixth resistor 38 (R6), and (4) to one side of a third capacitor 42 (C3). The other side of capacitor 42 (C3) is connected to the common buss 13. The other side of resistor 36 (R5) is connected to an output 52 of a second operational amplifier 50. The other side of resistor 38 (R6) is connected to an inverting input 46 of the operational amplifier 50 which has its non-inverting input 48 connected to the common buss 13. Resistor 38 (R6) is also connected to one end of a fourth capacitor 44 (C4) which has its other end connected to the output 52. The output 52 of operational amplifier 50 is connected to the terminal 54. Operational amplifier 50 may be of the type as hereinbefore given for operational amplifier 32. The output signal $e_o$, shown in FIG. 1, is developed by operational amplifier 50 and is present between the terminal 54 and a terminal 56 which is connected to the common buss 13.

A transfer function or closed-loop gain of the cascaded arranged networks 12 and 14 may be represented by the relationship (1) shown in FIG. 2. From the relationship (1) shown in FIG. 2, the selections of the resistance values of resistors R1-R7 and capacitance values to C1-C4 may result in various gain-frequency responses for the cascaded networks 12 and 14. The frequency response of networks, such as 12 and 14, is typically given in what is commonly known as the "roll-off rate" specified in decibels (dB) per frequency decade of the applied input signal. For one embodiment of the present invention the resistance and capacitance arrangement are selected to obtain 40 dB per decade roll-off rate for network 12 and also a 40 dB per decade roll-off rate for network 14. It should be noted from For the sake of simplicity, the transfer function shown in FIG. 2 for circuit arrangement 10 may be simplified to the relationship (3) illustrated in FIG. 3 by making the following assumptions;

R4 and R5=R2
R7=R1
C4=C2
Let R3 (R1+R2)=R6 (2R1+R2) and;
Let R3C1=R4C3

The output signal $e_o$ may now be determined by the relationship shown in FIG. 3 as follows;

If $e_a = 0$ then; (4)

$$\frac{e_o}{e_b} = -\left(\frac{R2}{R1}\right)\left(\frac{1}{1 + \frac{(R1\,R2 + R1\,R3 + R2\,R3)\,C2S}{R1} + R2\,R3\,C1\,C2S^2}\right)$$

If $e_b = 0$ then; (5)

$$\frac{e_o}{e_a} = \left(\frac{R2}{R1}\right)\left(\frac{1}{\left(1 + \frac{(R1\,R2 + R1\,R3 + R2\,R3)\,C2\,S}{R1} + R2\,R3\,C1\,C2\,S^2\right)^2}\right)$$

If the harmonic content of $e_b = 0$ then; (6)

$$\frac{e_o}{e_b - e_a} = -\left(\frac{R2}{R1}\right)\left(\frac{1}{\left(1 + \frac{(R1\,R2 + R1\,R3 + R2\,R3)\,C2\,S}{R1} + R2\,R3\,C1\,C2\,S^2\right)^2}\right)$$

FIG. 1 that the voltage signal $e_a$ is filtered by both networks 12 and 14 whereas voltage signal $e_b$ is only filtered by network 14; thus voltage signal $e_a$ is rolled-off at a rate of 80 dB per decade whereas voltage signal $e_b$ is only rolled-off at a rate of 40 dB per decade. The resistance and capacitive values desired to obtain these 80 dB per decade and 40 dB per decade roll-out rates which break down at approximately 210 radians/second are given in the following Table I.

TABLE I

| Component | Value |
|---|---|
| 16 (R1) | 300 KΩ |
| 18 (R2) | 75 KΩ |
| 20 (R3) | 60 KΩ |
| 22 (R4) | 75 KΩ |
| 24 (C1) | 0.1 μf |
| 26 (C2) | 0.05 μf |
| 36 (R5) | 75 KΩ |
| 38 (R6) | 33 KΩ |
| 40 (R7) | 300 KΩ |
| 42 (C3) | 0.18 μf |
| 44 (C4) | 0.05 μf |

The D.C. output of the combined networks 12 and 14 may be represented by the following equation;

$$e_o = \frac{e_a\,R2\,R5\,R7 - e_b\,R1\,R4\,R5}{R1\,R4\,R7} \quad (2)$$

Substituting the values of R1, R2, R4, R5, and R7 given in Table I into equation (2) results in a D.C. gain of $$e_o/(e_a-e_b)=0.25$$

for the circuit arrangement 10.

In the operation of the circuit arrangement 10 the voltage signal $e_a$ is applied to network 12 which produces a D.C. output from amplifier 32 that is determined by resistors 16 and 18. The A.C. attenuated output of amplifier 32 is determined by resistors 16, 18 and 20 and capacitors 24 and 26. The output signal at conductor 34 of operational amplifier 32 is applied to a first input of network 14 which has applied to its second input the voltage signal $e_b$. Network 14 produces a D.C. output from amplifier 50 that is determined by the input signals and resistors 22, 36 and 40. The A.C. attenuated output of amplifier 50 is determined by resistors 22, 36, 38 and 40 and capacitors 42 and 44. The output signal appearing between conductors 52 and 48 is the circuit output $e_o$ appearing between terminals 54 and 56. The D.C. component of output signal $e_o$ is representative of the voltage difference existing across resistor 17, which, in turn, is representative of the pilot wire current. The A.C. voltage content present in output signal $e_o$ is substantially reduced from the value found within either signals $e_a$ or $e_b$.

The circuit arrangement 10 provides an output signal $e_o$ representative of D.C. current flowing within the pilot wires 76 and 78 of the pilot wire system 60. An external device (not shown) monitors the signal $e_o$ so that if it is less than or exceeds a predetermined range of values, an alarm condition related to the pilot wires 76 and 78 exists within the pilot wire protection system 60.

It should now be appreciated that the present invention provides a circuit 10 that performs both D.C. level shifting and filtering. The D.C. level of the output of circuit 10 is proportional to the D.C. voltage difference between the D.C. components of the applied voltage signal $e_a$ and $e_b$. The D.C. output signal of the circuit is substantially free of A.C. voltage components inherent in the applied signals $e_a$ and $e_b$. The circuit 10 filters the voltage signal $e_a$, which comprises a D.C. voltage having a relatively high A.C. voltage component impressed thereon, by a ratio of approximately two (2) to one (1) relative to the filtering of signal $e_b$. The overall filtering of circuit 10 produces a D.C. output signal $e_o$ which may be substantially free of A.C. voltage inherent in both $e_a$ and $e_b$ and may be used by an external device to monitor the status of the pilot wires 76 and 78.

While I have shown and described particular embodiments of my invention, it will be obvious to those skilled in the art that various changes and modifications may be made without departing from my invention in its broader aspects; and I, therefore, intend herein to cover all such changes and modifications as fall within the true spirit and scope of my invention.

What is claimed is:

1. A level shifting and filtering circuit for developing a D.C. output signal having a level which is representative of the difference between the D.C. voltage levels of a first and a second voltage signal each containing D.C. and A.C. components, said first voltage signal being present between a first and second terminal and said second voltage signal being present between a third and fourth terminal, said second and fourth terminals being coupled to each other, said circuit filtering the A.C. voltage component of said first and said second voltage signals in the development of said D.C. output signal, said circuit filtering the A.C. voltage component of said first voltage signal being performed to an extent which is substantially greater than the filtering being performed on said second voltage signal, said circuit comprising:

a first network having a first plurality of resistive and capacitive elements and further having a first differential means having a first and a second input for developing an output signal representative of the voltage difference applied between said first and said second inputs, said first input being coupled to said first terminal by a first portion of said first plurality of resistive and capacitive elements, said second input being coupled to said second terminal, said output signal of said first differential means being fedback to said first input by a second portion of said first plurality of resistive and capacitive elements, said first plurality of resistive and capacitive elements having preselected values that determine the closed-loop response of said first network and reduce the A.C. voltage component existing in said output signal of said first differential means by a predetermined amount, a second network having a second plurality of resistive and capacitive elements and further having a second differential means having a first and a second input for developing an output signal representative of the voltage difference applied between said first and said second inputs, said first input being coupled to said third terminal by a first portion of said second plurality of resistive and capacitive elements, said first input also being coupled to said output signal of said first differential means by a second portion of said second plurality of resistive and capacitive elements, said second input being coupled to said fourth terminal, said output signal of said second differential means being fed-back to said first input by a third portion of said second plurality of resistive and capacitive elements, said second plurality of resistive and capacitive elements having preselected values that determine the closed-loop response of said second network and reduce the A.C. voltage component existing in said output signal of said second differential means by a predetermined amount, said output D.C. signal of said second differential means being representative of the voltage difference between the D.C. voltage levels of said first and said second voltage signals.

2. A circuit according to claim 1 wherein said first plurality of resistive and capacitive elements comprises: a first resistor having a first and a second end, said first end of said first resistor being connected to said first terminal and said second end of said first resistor being connected to a second resistor, a third resistor and a first capacitor, one end of said first capacitor being coupled to said second terminal, the other end of said third resistor being connected to said first input of said first differential means and to one end of a second capacitor, said output of said first differential means being coupled to the other end of said second capacitor and to the other end of said second resistor.

3. A circuit according to claim 2 wherein said first plurality of resistive and capacitive elements have values selected to produce an output signal of said first differential means having a characteristic of about 40 dB per decade roll-off rate of said first voltage.

4. A circuit according to claim 1 or 2 wherein said second plurality of resistive and capacitive elements comprises:

a fourth resistor having a first end connected to said output signal of said first differential means and a second end connected to a first end of a fifth, of a sixth and of a seventh resistor and also to a first end of a third capacitor, said seventh resistor having a second end connected to said third terminal, said third capacitor having a second end connected to said fourth terminal, said sixth resistor having a second end connected to said first input of said second differential means and to one end of a fourth capacitor, said output of said second differential means being coupled to the other end of said fourth capacitor and to the other end of said fifth resistor.

5. A circuit according to claim 4 wherein said second plurality of resistive and capacitive elements have values selected to produce an output signal of said second differential means having a characteristic of about 80 dB per decade roll-off rate of said first voltage signal and a characteristic of about 40 dB per decade roll-off rate of said second voltage signal.

* * * * *